(12) United States Patent  
Khlat et al.

(10) Patent No.: US 12,301,184 B2  
(45) Date of Patent: *May 13, 2025

(54) AVERAGE POWER TRACKING POWER MANAGEMENT CIRCUIT

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/203,197

(22) Filed: May 30, 2023

(65) Prior Publication Data

US 2023/0299730 A1    Sep. 21, 2023

Related U.S. Application Data

(63) Continuation of application No. 17/217,594, filed on Mar. 30, 2021, now Pat. No. 11,736,076.  
(Continued)

(51) Int. Cl.  
*H03F 1/30* (2006.01)  
*H03F 1/02* (2006.01)  
(Continued)

(52) U.S. Cl.  
CPC .......... *H03F 3/245* (2013.01); *H03F 1/0233* (2013.01); *H03F 3/195* (2013.01); *H03F 2200/105* (2013.01); *H03F 2200/451* (2013.01)

(58) Field of Classification Search  
CPC ....................................................... H03F 1/30  
(Continued)

(56) References Cited

U.S. PATENT DOCUMENTS 5,982,233 A    11/1999  Hellmark et al.  
7,859,338 B2   12/2010  Bajdechi et al.  
(Continued)

FOREIGN PATENT DOCUMENTS

DE    102019218816 A1    6/2020  
EP        2254237 A2    11/2010  
(Continued)

OTHER PUBLICATIONS

Non-Final Office Action for U.S. Appl. No. 17/217,654, mailed Jul. 1, 2022, 9 pages.  
(Continued)

*Primary Examiner* — Henry Choe  
(74) *Attorney, Agent, or Firm* — Withrow & Terranova, P.L.L.C.

(57) ABSTRACT

An average power tracking (APT) power management circuit is provided. The APT power management circuit is configured to generate a first APT voltage(s) for a first power amplifier(s) and a second APT voltage(s) for a second power amplifier(s). The APT power management circuit further includes a pair of switcher circuits that can generate a pair of reference voltages. Depending on various operating scenarios of the APT power management circuit, it is possible to selectively output any of the reference voltages as any one or more of the first APT voltage(s) and the second APT voltage(s). As such, it is possible to flexibly configure the APT power management circuit to support the various operating scenarios based on a minimum possible number of the switcher circuits, thus helping to reduce footprint and cost of the APT power management circuit.

10 Claims, 2 Drawing Sheets

Related U.S. Application Data

Figure 1:
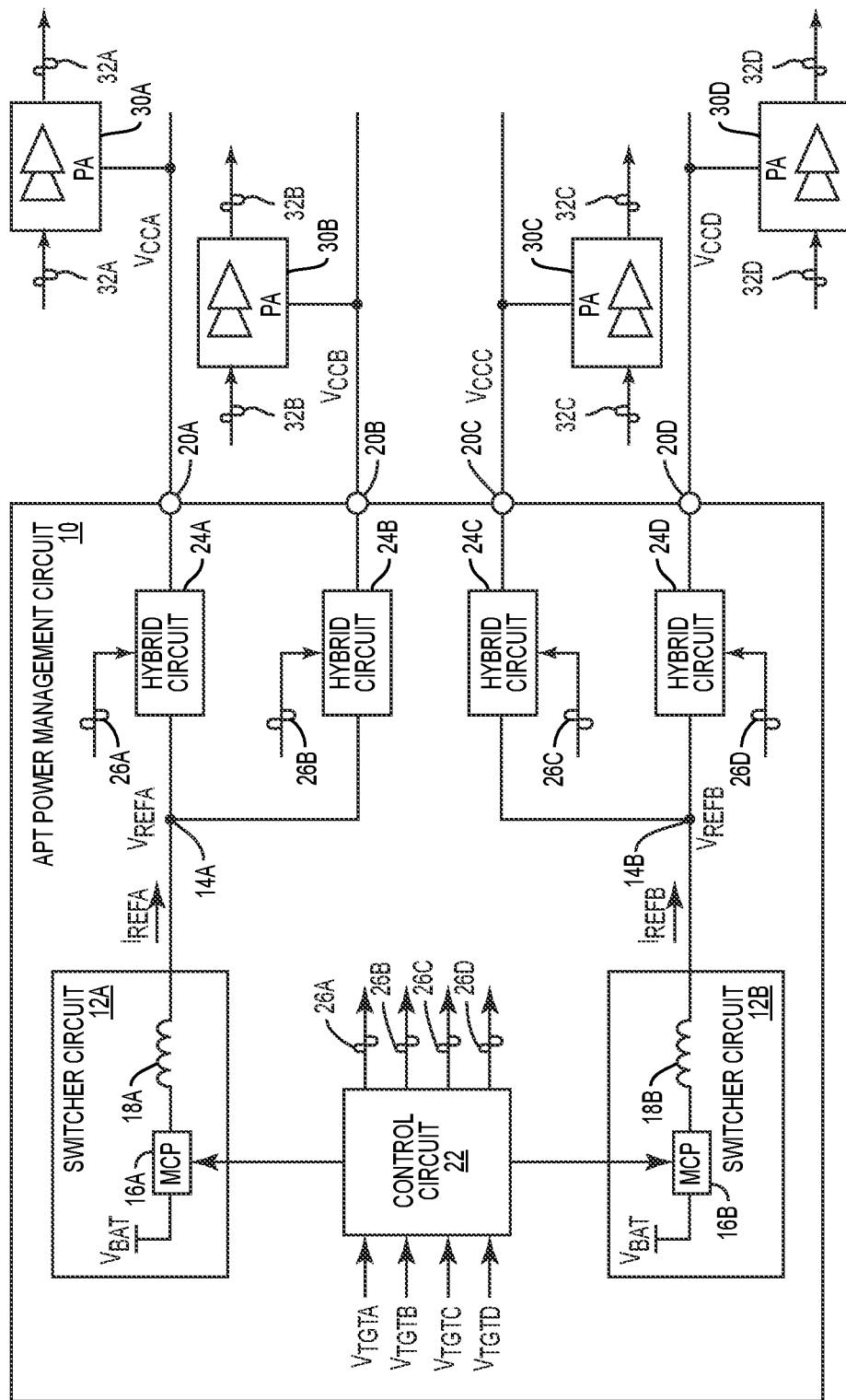

(60) Provisional application No. 63/037,282, filed on Jun. 10, 2020.

(51) Int. Cl.
*H03F 3/195* (2006.01)
*H03F 3/24* (2006.01)

(58) Field of Classification Search
USPC .................................... 330/297, 296, 285
See application file for complete search history.

(56) References Cited

U.S. PATENT DOCUMENTS

| | | | |
|---|---|---|---|
| 8,159,309 | B1 | 4/2012 | Khlat et al. |
| 8,718,188 | B2 | 5/2014 | Balteanu et al. |
| 8,912,769 | B2 | 12/2014 | Lin et al. |
| 9,020,453 | B2 | 4/2015 | Briffa et al. |
| 9,069,365 | B2 | 6/2015 | Brown et al. |
| 9,148,090 | B2 | 9/2015 | Tsuji |
| 9,172,331 | B2 | 10/2015 | Nagasaku et al. |
| 9,231,527 | B2 | 1/2016 | Hur et al. |
| 9,252,724 | B2 * | 2/2016 | Wimpenny ........... H03F 1/0277 |
| 9,350,299 | B2 | 5/2016 | Tsuji |
| 9,356,512 | B2 | 5/2016 | Chowdhury et al. |
| 9,356,760 | B2 | 5/2016 | Larsson et al. |
| 9,391,567 | B2 | 7/2016 | Kacman |
| 9,407,476 | B2 | 8/2016 | Lim et al. |
| 9,496,828 | B2 | 11/2016 | Ye |
| 9,560,595 | B2 | 1/2017 | Dakshinamurthy et al. |
| 9,590,563 | B2 * | 3/2017 | Wimpenny ........... H03F 1/0277 |
| 9,614,477 | B1 | 4/2017 | Rozenblit et al. |
| 9,634,560 | B2 | 4/2017 | Ek |
| 9,755,677 | B2 | 9/2017 | Talty et al. |
| 9,991,913 | B1 | 6/2018 | Dinur et al. |
| 10,097,145 | B1 | 10/2018 | Khlat et al. |
| 10,103,926 | B1 | 10/2018 | Khlat |
| 10,142,074 | B2 | 11/2018 | Wang et al. |
| 10,243,524 | B2 | 3/2019 | Orr |
| 10,326,408 | B2 | 6/2019 | Khlat et al. |
| 10,476,437 | B2 | 11/2019 | Nag et al. |
| 10,778,094 | B2 | 9/2020 | de Cremoux |
| 10,862,428 | B2 | 12/2020 | Henzler et al. |
| 10,998,859 | B2 | 5/2021 | Khlat |
| 11,018,627 | B2 | 5/2021 | Khlat |
| 11,018,638 | B2 | 5/2021 | Khlat et al. |
| 11,088,660 | B2 | 8/2021 | Lin et al. |
| 11,223,323 | B2 | 1/2022 | Drogi et al. |
| 11,223,325 | B2 | 1/2022 | Drogi et al. |
| 11,349,513 | B2 * | 5/2022 | Stockert ............... H04B 1/0475 |
| 11,387,789 | B2 | 7/2022 | Khlat et al. |
| 11,424,719 | B2 | 8/2022 | Khlat |
| 11,539,330 | B2 | 12/2022 | Khlat |
| 11,569,783 | B2 | 1/2023 | Nomiyama et al. |
| 11,588,449 | B2 | 2/2023 | Khlat et al. |
| 11,665,654 | B2 | 5/2023 | Park et al. |
| 11,716,057 | B2 | 8/2023 | Khlat |
| 11,728,774 | B2 | 8/2023 | Khlat |
| 11,757,414 | B2 | 9/2023 | Drogi et al. |
| 11,894,767 | B2 | 2/2024 | Khlat et al. |
| 11,909,385 | B2 | 2/2024 | Khlat |
| 11,973,469 | B2 | 4/2024 | Retz et al. |
| 11,984,853 | B2 | 5/2024 | Khlat |
| 11,984,854 | B2 | 5/2024 | Khlat et al. |
| 12,063,018 | B2 | 8/2024 | Khlat |
| 2003/0099230 | A1 | 5/2003 | Wenk |
| 2004/0179382 | A1 | 9/2004 | Thaker et al. |
| 2011/0109393 | A1 | 5/2011 | Adamski et al. |
| 2012/0068767 | A1 | 3/2012 | Henshaw et al. |
| 2013/0141063 | A1 | 6/2013 | Kay et al. |
| 2013/0141068 | A1 | 6/2013 | Kay et al. |
| 2014/0055197 | A1 | 2/2014 | Khlat et al. |
| 2014/0097895 | A1 | 4/2014 | Khlat et al. |
| 2014/0232458 | A1 * | 8/2014 | Arno .................... H03F 1/0227 330/127 |
| 2014/0312710 | A1 | 10/2014 | Li |
| 2014/0315504 | A1 | 10/2014 | Sakai et al. |
| 2014/0361837 | A1 * | 12/2014 | Strange .................. H03F 3/195 330/297 |
| 2015/0270806 | A1 * | 9/2015 | Wagh .................. H03F 3/45188 330/296 |
| 2016/0094192 | A1 | 3/2016 | Khesbak et al. |
| 2016/0241208 | A1 | 8/2016 | Lehtola |
| 2016/0294587 | A1 | 10/2016 | Jiang et al. |
| 2017/0331433 | A1 | 11/2017 | Khlat |
| 2017/0373644 | A1 | 12/2017 | Gatard et al. |
| 2018/0092047 | A1 | 3/2018 | Merlin |
| 2018/0234011 | A1 | 8/2018 | Muramatsu et al. |
| 2018/0257496 | A1 | 9/2018 | Andoh et al. |
| 2018/0278213 | A1 | 9/2018 | Henzler et al. |
| 2018/0351454 | A1 | 12/2018 | Khesbak et al. |
| 2019/0068234 | A1 | 2/2019 | Khlat et al. |
| 2019/0109566 | A1 | 4/2019 | Folkmann et al. |
| 2019/0181813 | A1 | 6/2019 | Maxim et al. |
| 2019/0222175 | A1 | 7/2019 | Khlat et al. |
| 2019/0288645 | A1 | 9/2019 | Nag et al. |
| 2019/0334750 | A1 | 10/2019 | Nomiyama et al. |
| 2019/0356285 | A1 | 11/2019 | Khlat et al. |
| 2020/0076297 | A1 | 3/2020 | Nag et al. |
| 2020/0127612 | A1 | 4/2020 | Khlat et al. |
| 2020/0136575 | A1 | 4/2020 | Khlat et al. |
| 2020/0204422 | A1 | 6/2020 | Khlat |
| 2020/0212796 | A1 | 7/2020 | Murphy et al. |
| 2020/0228063 | A1 | 7/2020 | Khlat |
| 2020/0266766 | A1 | 8/2020 | Khlat et al. |
| 2020/0295708 | A1 | 9/2020 | Khlat |
| 2020/0321917 | A1 | 10/2020 | Nomiyama et al. |
| 2020/0336105 | A1 | 10/2020 | Khlat |
| 2020/0336111 | A1 | 10/2020 | Khlat |
| 2020/0382061 | A1 | 12/2020 | Khlat |
| 2020/0382062 | A1 | 12/2020 | Khlat |
| 2020/0389132 | A1 | 12/2020 | Khlat et al. |
| 2021/0036604 | A1 | 2/2021 | Khlat et al. |
| 2021/0099137 | A1 | 4/2021 | Drogi et al. |
| 2021/0126599 | A1 | 4/2021 | Khlat et al. |
| 2021/0175798 | A1 | 6/2021 | Liang |
| 2021/0184708 | A1 | 6/2021 | Khlat |
| 2021/0194517 | A1 | 6/2021 | Mirea et al. |
| 2021/0218374 | A1 | 7/2021 | Poulin |
| 2021/0226585 | A1 | 7/2021 | Khlat |
| 2021/0257971 | A1 | 8/2021 | Kim et al. |
| 2021/0265953 | A1 | 8/2021 | Khlat |
| 2021/0288615 | A1 | 9/2021 | Khlat |
| 2021/0389789 | A1 | 12/2021 | Khlat et al. |
| 2021/0391833 | A1 | 12/2021 | Khlat et al. |
| 2022/0021302 | A1 | 1/2022 | Khlat et al. |
| 2022/0029614 | A1 | 1/2022 | Khlat |
| 2022/0037982 | A1 | 2/2022 | Khlat et al. |
| 2022/0052655 | A1 | 2/2022 | Khalt |
| 2022/0057820 | A1 | 2/2022 | Khlat et al. |
| 2022/0066487 | A1 | 3/2022 | Khlat |
| 2022/0069788 | A1 | 3/2022 | King et al. |
| 2022/0123744 | A1 | 4/2022 | Khlat |
| 2022/0200447 | A1 | 6/2022 | Khlat |
| 2022/0224364 | A1 | 7/2022 | Kim et al. |
| 2022/0271714 | A1 | 8/2022 | Khlat |
| 2022/0294486 | A1 | 9/2022 | Cao et al. |
| 2022/0407465 | A1 | 12/2022 | Khlat |
| 2023/0081095 | A1 | 3/2023 | Khlat |
| 2023/0085587 | A1 | 3/2023 | Shute |
| 2023/0118768 | A1 | 4/2023 | Khlat |
| 2023/0119987 | A1 | 4/2023 | Khlat |
| 2023/0124652 | A1 | 4/2023 | Khlat et al. |
| 2023/0124941 | A1 | 4/2023 | Khlat |
| 2023/0133842 | A1 | 5/2023 | Khlat |
| 2024/0172131 | A1 | 5/2024 | Ballantyne et al. |
| 2024/0223129 | A1 | 7/2024 | Retz et al. |

FOREIGN PATENT DOCUMENTS

| | | |
|---|---|---|
| WO | 2018187245 A1 | 10/2018 |
| WO | 2021016350 A1 | 1/2021 |

(56) References Cited

FOREIGN PATENT DOCUMENTS

OTHER PUBLICATIONS

Non-Final Office Action for U.S. Appl. No. 17/218,904, mailed May 25, 2022, 14 pages.
Notice of Allowance for U.S. Appl. No. 17/315,652, mailed Jun. 20, 2022, 8 pages.
Mellon, L., "Data Transmission—Parallel vs Serial," Jul. 10, 2017, https://www.quantil.com/content-delivery-insights/content-acceleration/data-transmission/, 4 pages.
International Search Report and Written Opinion for International Patent Application No. PCT/US2021/044596, mailed Apr. 21, 2022, 13 pages.
Written Opinion for International Patent Application No. PCT/US2021/044596, mailed Jun. 10, 2022, 6 pages.
International Preliminary Report on Patentability for International Patent Application No. PCT/US2021/044596, mailed Sep. 1, 2022, 19 pages.
Notice of Allowance for U.S. Appl. No. 17/182,539, mailed Sep. 14, 2022, 7 pages.
Notice of Allowance for U.S. Appl. No. 17/217,654, mailed Oct. 12, 2022, 8 pages.
Non-Final Office Action for U.S. Appl. No. 17/237,244, mailed Sep. 20, 2021, 14 pages.
Notice of Allowance for U.S. Appl. No. 17/237,244, mailed Jan. 27, 2022, 8 pages.
Notice of Allowance for U.S. Appl. No. 17/218,904, mailed Aug. 26, 2022, 9 pages.
Non-Final Office Action for U.S. Appl. No. 17/325,482, mailed Sep. 30, 2021, 10 pages.
Non-Final Office Action for U.S. Appl. No. 17/325,482, mailed Mar. 15, 2022, 10 pages.
Final Office Action for U.S. Appl. No. 17/325,482, mailed Aug. 16, 2022, 12 pages.
Advisory Action for U.S. Appl. No. 17/325,482, mailed Oct. 14, 2022, 3 pages.
Non-Final Office Action for U.S. Appl. No. 17/315,652, mailed Sep. 2, 2021, 7 pages.
Non-Final Office Action for U.S. Appl. No. 17/315,652, mailed Feb. 14, 2022, 12 pages.
Non-Final Office Action for U.S. Appl. No. 17/408,899, mailed Aug. 29, 2022, 13 pages.
International Search Report and Written Opinion for International Patent Application No. PCT/US2021/061721, mailed Mar. 14, 2022, 13 pages.
Written Opinion for International Patent Application No. PCT/US2021/061721, mailed Sep. 9, 2022, 7 pages.
Notice of Allowance for U.S. Appl. No. 17/325,482, mailed Nov. 30, 2022, 8 pages.
Final Office Action for U.S. Appl. No. 17/408,899, mailed Dec. 27, 2022, 13 pages.
Paek, J.S. et al., "15.2 A 90ns/V Fast-Transition Symbol-Power-Tracking Buck Converter for 5G mm-Wave Phased-Array Transceiver," 2019 IEEE International Solid-State Circuits Conference, Feb. 2019, San Francisco, CA, USA, IEEE, 3 pages.
Notice of Allowance for U.S. Appl. No. 17/217,594, mailed Apr. 3, 2023, 7 pages.
Notice of Allowance for U.S. Appl. No. 17/408,899, mailed Feb. 24, 2023, 9 pages.
Non-Final Office Action for U.S. Appl. No. 17/942,472, mailed Feb. 16, 2023, 13 pages.
Extended European Search Report for European Patent Application No. 22195683.2, mailed Feb. 10, 2023, 12 pages.
Written Opinion for International Patent Application No. PCT/US2021/061721, mailed Mar. 1, 2023, 7 pages.
International Preliminary Report on Patentability for International Patent Application No. PCT/US2021/061721, mailed Apr. 4, 2023, 21 pages.
Extended European Search Report for European Patent Application No. 22200302.2, mailed Mar. 1, 2023, 14 pages.
Extended European Search Report for European Patent Application No. 22200322.0, mailed Mar. 1, 2023, 13 pages.
Extended European Search Report for European Patent Application No. 22200300.6, mailed Feb. 24, 2023, 10 pages.
Extended European Search Report for European Patent Application No. 22200111.7, mailed Feb. 20, 2023, 9 pages.
Notice of Allowance for U.S. Appl. No. 17/316,828, mailed Sep. 13, 2023, 8 pages.
Final Office Action for U.S. Appl. No. 17/942,472, mailed Jul. 19, 2023, 15 pages.
Advisory Action Action for U.S. Appl. No. 17/942,472, mailed Jul. 19, 2023, 3 pages.
Notice of Allowance for U.S. Appl. No. 17/942,472, mailed Oct. 18, 2023, 10 pages.
Corrected Notice of Allowability for U.S. Appl. No. 17/942,472, mailed Nov. 17, 2023, 5 pages.
Notice of Allowance for U.S. Appl. No. 17/947,567, mailed Oct. 23, 2024, 11 pages.
Non-Final Office Action for U.S. Appl. No. 17/946,470, mailed Nov. 20, 2024, 31 pages.

* cited by examiner

AVERAGE POWER TRACKING POWER MANAGEMENT CIRCUIT

RELATED APPLICATIONS

This application is a continuation of U.S. patent application Ser. No. 17/217,594, filed Mar. 30, 2021, now U.S. Pat. No. 11,736,076, which claims the benefit of provisional patent application Ser. No. 63/037,282, filed Jun. 10, 2020, the disclosures of which are hereby incorporated herein by reference in their entireties.

FIELD OF THE DISCLOSURE

The technology of the disclosure relates generally to an average power tracking (APT) power management circuit.

BACKGROUND

Fifth-generation (5G) new radio (NR) (5G-NR) have been widely regarded as the next generation of wireless communication technology beyond the current third-generation (3G) and fourth-generation (4G) technologies. In this regard, a wireless communication device capable of supporting the 5G-NR wireless communication technology is expected to achieve higher data rate, improved coverage range, enhanced signaling efficiency, and reduced latency across a wide range of radio frequency (RF) bands, which include a low-band (below 1 GHz), a mid-band (1 GHz to 6 GHz), and a high-band (above 24 GHz). Moreover, the wireless communication device may still support the legacy 3G and 4G technologies for backward compatibility.

In addition, the wireless communication device is required to support local area networking technologies, such as Wi-Fi, in both 2.4 GHz and 5 GHz bands. The latest 802.11ax standard has introduced a dynamic power control feature to allow the wireless communication device to transmit a Wi-Fi signal with a maximum power ranging from −10 dBm to 23 dBm. Accordingly, a Wi-Fi power amplifier(s) in the wireless communication device must be able to adapt the power level of the Wi-Fi signal on a per-frame basis. As a result, a power management integrated circuit (PMIC) must be able to adapt an average power tracking (APT) voltage supplied to the Wi-Fi power amplifier(s) within Wi-Fi inter-frame spacing (IFS) to help maintain linearity and efficiency of the Wi-Fi power amplifier(s).

Notably, the Wi-Fi IFS may only last sixteen microseconds (16 μs). Depending on specific configurations of the Wi-Fi system, such as bandwidth mode, trigger frame format, modulation and coding scheme (MCS), and delays associated with Wi-Fi physical layer (PHY) and communication buses, the actual temporal limit for the PMIC to adapt the APT voltage(s) may be as short as one-half of a microsecond (0.5 μs). In this regard, it is desirable for the PMIC to adapt the APT voltage(s) from one level to another within a predetermined temporal limit (e.g., 0.5 μs).

SUMMARY

Embodiments of the disclosure relate to an average power tracking (APT) power management circuit. The APT power management circuit is configured to generate a first APT voltage(s) for a first power amplifier(s) and a second APT voltage(s) for a second power amplifier(s). The APT power management circuit further includes a pair of switcher circuits that can generate a pair of reference voltages. Depending on various operating scenarios of the APT power management circuit, it is possible to selectively output any of the reference voltages as any one or more of the first APT voltage(s) and the second APT voltage(s). As such, it is possible to flexibly configure the APT power management circuit to support the various operating scenarios based on a minimum possible number of the switcher circuits, thus helping to reduce footprint and cost of the APT power management circuit.

In one aspect, an APT power management circuit is provided. The APT power management circuit includes a first switcher circuit configured to generate a first reference voltage and induce a first low-frequency current at a first reference node. The APT power management circuit also includes a second switcher circuit configured to generate a second reference voltage and induce a second low-frequency current at a second reference node. The APT power management circuit also includes a number of first hybrid circuits each coupled between the first reference node and a respective one of a number of first voltage outputs to output a respective one of a number of first APT voltages. The APT power management circuit also includes a number of second hybrid circuits each coupled between the second reference node and a respective one of a number of second voltage outputs to output a respective one of a number of second APT voltages. The APT power management circuit also includes a control circuit. The control circuit is configured to cause at least one of the plurality of first voltage outputs to output the first reference voltage as the respective one of the plurality of first APT voltages. The control circuit is also configured to cause at least one of the plurality of second voltage outputs to output the second reference voltage as the respective one of the plurality of second APT voltages.

In another aspect, an APT apparatus is provided. The APT apparatus includes an APT power management circuit. The APT power management circuit includes a first switcher circuit configured to generate a first reference voltage and induce a first low-frequency current at a first reference node. The APT power management circuit also includes a second switcher circuit configured to generate a second reference voltage and induce a second low-frequency current at a second reference node. The APT power management circuit also includes a number of first hybrid circuits each coupled between the first reference node and a respective one of a number of first voltage outputs to output a respective one of a number of first APT voltages.

The APT power management circuit also includes a number of second hybrid circuits each coupled between the second reference node and a respective one of a number of second voltage outputs to output a respective one of a number of second APT voltages. The APT power management circuit also includes a control circuit. The control circuit is configured to cause at least one of the plurality of first voltage outputs to output the first reference voltage as the respective one of the plurality of first APT voltages. The control circuit is also configured to cause at least one of the plurality of second voltage outputs to output the second reference voltage as the respective one of the plurality of second APT voltages.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

Figure 2:
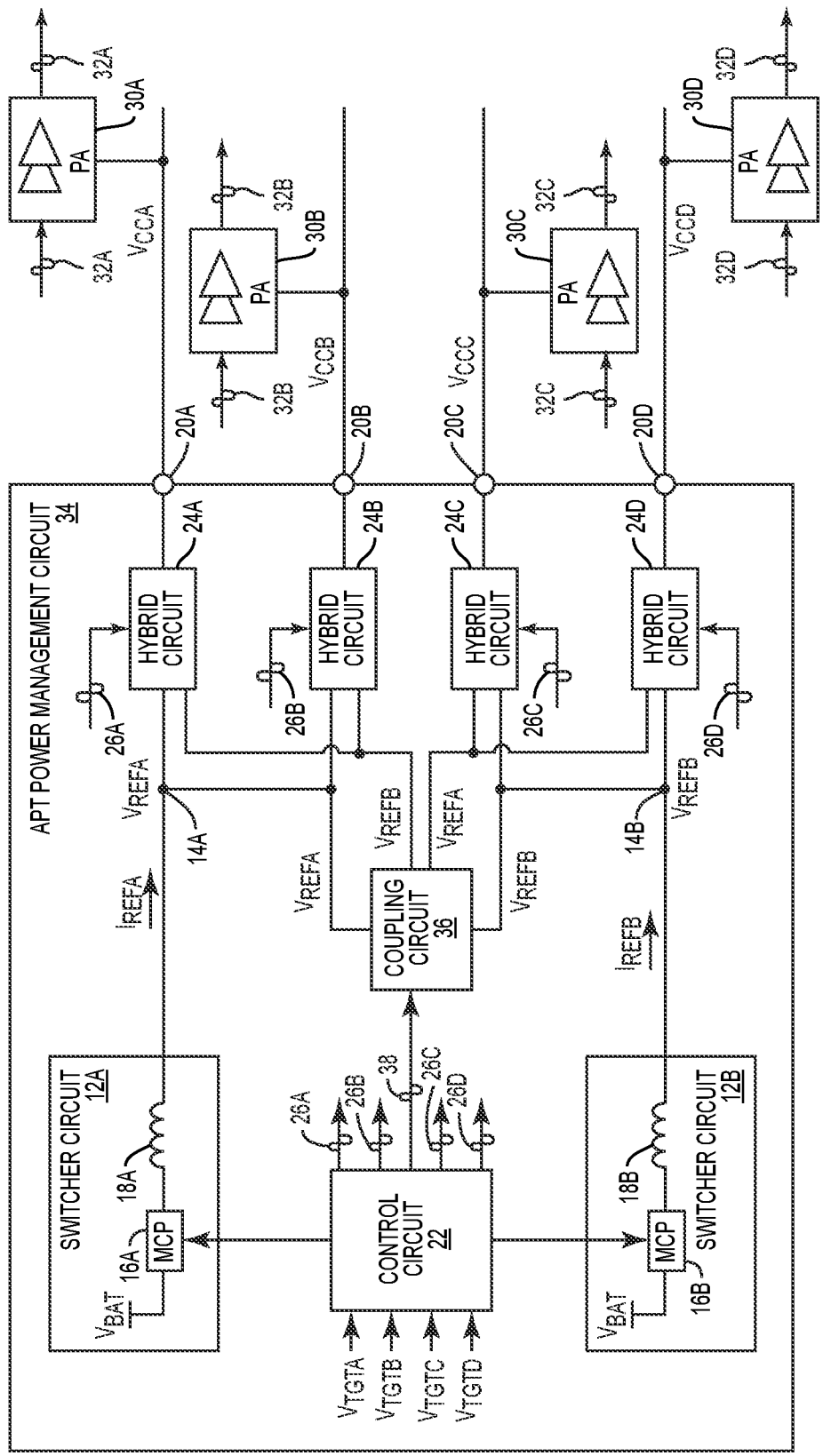

The accompanying drawing figures incorporated in and forming a part of this specification illustrate several aspects of the disclosure, and together with the description serve to explain the principles of the disclosure.

FIG. 1 is a schematic diagram of an exemplary average power tracking (APT) power management circuit configured according to an embodiment of the present disclosure; and FIG. 2 is a schematic diagram of an exemplary APT power management circuit configured according to another embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an average power tracking (APT) power management circuit. The APT power management circuit is configured to generate a first APT voltage(s) for a first power amplifier(s) and a second APT voltage(s) for a second power amplifier(s). The APT power management circuit further includes a pair of switcher circuits that can generate a pair of reference voltages. Depending on various operating scenarios of the APT power management circuit, it is possible to selectively output any of the reference voltages as any one or more of the first APT voltage(s) and the second APT voltage(s). As such, it is possible to flexibly configure the APT power management circuit to support the various operating scenarios based on a minimum possible number of the switcher circuits, thus helping to reduce footprint and cost of the APT power management circuit.

In this regard, FIG. 1 is a schematic diagram of an exemplary APT power management circuit 10 configured according to an embodiment of the present disclosure to adapt one or more of a pair of first APT voltages $V_{CCA}$, $V_{CCB}$ and a pair of second APT voltages $V_{CCC}$, $V_{CCD}$ from one level to another within a predetermined temporal limit.

The APT power management circuit 10 includes a first switcher circuit 12A and a second switcher circuit 12B. Notably, the first switcher circuit 12A and the second switcher circuit 12B are merely non-limiting examples. It should be appreciated that the APT power management circuit 10 can be configured to include additional switcher circuits, if desired.

The first switcher circuit 12A is coupled to a first reference node 14A and configured to generate a first reference voltage $V_{REFA}$ (e.g., a constant voltage) and induce a first low-frequency current $I_{REFA}$ (e.g., a direct current) at the first reference node 14A. In a non-limiting example, the first switcher circuit 12A includes a first multi-level charge pump 16A (denoted as MCP) and a first power inductor 18A. The first multi-level charge pump 16A is configured to generate the first reference voltage $V_{REFA}$ at multiple levels based on a battery voltage $V_{BAT}$. For example, the first multi-level charge pump 16A can operate in a buck mode to generate the first reference voltage $V_{REFA}$ at or below the battery voltage $V_{BAT}$, or to operate in a boost mode to generate the first reference voltage $V_{REFA}$ above the battery voltage $V_{BAT}$. The first power inductor 18A is coupled between the first multi-level charge pump 16A and the first reference node 14A. The first power inductor 18A is configured to induce the first low-frequency current $I_{REFA}$ based on the first reference voltage $V_{REFA}$.

The second switcher circuit 12B is coupled to a second reference node 14B and configured to generate a second reference voltage $V_{REFB}$ (e.g., a constant voltage) and induce a second low-frequency current $I_{REFB}$ (e.g., a direct current) at the second reference node 14B. In a non-limiting example, the second switcher circuit 12B includes a second multi-level charge pump 16B (denoted as MCP) and a second power inductor 18B. The second multi-level charge pump 16B is configured to generate the second reference voltage $V_{REFB}$ at multiple levels based on the battery voltage $V_{BAT}$. For example, the second multi-level charge pump 16B can operate in the buck mode to generate the second reference voltage $V_{REFB}$ at or below the battery voltage $V_{BAT}$, or to operate in the boost mode to generate the second reference voltage $V_{REFB}$ above the battery voltage $V_{BAT}$. The second power inductor 18B is coupled between the second multi-level charge pump 16B and the second reference node 14B. The second power inductor 18B is configured to induce the second low-frequency current $I_{REFB}$ based on the second reference voltage $V_{REFB}$.

The APT power management circuit 10 includes a pair of first voltage outputs 20A, 20B and a pair of second voltage outputs 20C, 20D. The first voltage outputs 20A, 20B are configured to output the first APT voltages $V_{CCA}$, $V_{CCB}$, respectively. The second voltage outputs 20C, 20D are configured to output the second APT voltages $V_{CCC}$, $V_{CCD}$, respectively. It should be appreciated that the APT power management circuit 10 can include additional voltage outputs for outputting additional APT voltages, if desired.

The APT power management circuit 10 includes a control circuit 22, which can be a field-programmable gate array (FPGA), as an example. The control circuit 22 is configured to receive a pair of first APT target voltages $V_{TGTA}$, $V_{TGTB}$ corresponding to the first APT voltages $V_{CCA}$, $V_{CCB}$, respectively. The control circuit 22 is configured to receive a pair of second APT target voltages $V_{TGTC}$, $V_{TGTD}$ corresponding to the second APT voltages $V_{CCC}$, $V_{CCD}$, respectively. As discussed below, the control circuit 22 can selectively couple any of the first reference voltage $V_{REFA}$ and the second reference voltage $V_{REFB}$ to any one or more of the first voltage outputs 20A, 20B and the second voltage outputs 20C, 20D based on the first APT target voltages $V_{TGTA}$, $V_{TGTB}$ and/or the second APT voltages $V_{CCC}$, $V_{CCD}$. As such, the APT power management circuit 10 can generate the first APT voltages $V_{CCA}$, $V_{CCB}$ and the second APT voltages $V_{CCC}$, $V_{CCD}$ in various operating scenarios based on the first switcher circuit 12A and the second switcher circuit 12B. As a result, it is possible to reduce footprint and cost of the APT power management circuit 10.

The APT power management circuit 10 can be configured to include a pair of first hybrid circuits 24A, 24B and a pair of second hybrid circuits 24C, 24D. The first hybrid circuits 24A, 24B are coupled between the first reference node 14A and the first voltage outputs 20A, 20B, respectively. The second hybrid circuits 24C, 24D are coupled between the second reference node 14B and the second voltage outputs 20C, 20D, respectively. Understandably, the APT power management circuit 10 can include additional hybrid circuits if additional voltage outputs are added to the APT power management circuit 10.

In a non-limiting example, each of the first hybrid circuits 24A, 24B and the second hybrid circuits 24C, 24D can include a transistor(s) that can be controlled via a respective bias voltage. As such, each of the first hybrid circuits 24A, 24B and the second hybrid circuits 24C, 24D can operate in a switch mode or in a regulator mode. When operating in the switch mode, each of the first hybrid circuits 24A, 24B and the second hybrid circuits 24C, 24D functions as a switch to couple a respective one of the first reference voltage $V_{REFA}$ and the second reference voltage $V_{REFB}$ and/or a respective one of the first low-frequency current $I_{REFA}$ and the second low-frequency current $I_{REFB}$ directly to a respective one of the first voltage outputs 20A, 20B and the second voltage outputs 20C, 20D. When operating in the regulator mode, each of the first hybrid circuits 24A, 24B and the second hybrid circuits 24C, 24D functions as a low dropout (LDO) regulator to regulate (e.g., reduce) a respective one of the first reference voltage $V_{REFA}$ and the second reference voltage $V_{REFB}$ and/or a respective one of the first low-frequency current $I_{REFA}$ and the second low-frequency current $I_{REFB}$ at a respective one of the first voltage outputs 20A, 20B and the second voltage outputs 20C, 20D. The control circuit 22 may cause each of the first hybrid circuits 24A, 24B and the second hybrid circuits 24C, 24D to operate in the switch mode or the regulator mode via a respective one of a pair of first control signals 26A, 26B and a pair of second control signals 26C, 26D.

The control circuit 22 may be configured to cause at least one of the first hybrid circuits 24A, 24B and at least one of the second hybrid circuits 24C, 24D to operate in the switch mode. Accordingly, the control circuit 22 can cause at least one of the first voltage outputs 20A, 20B to output the first reference voltage $V_{REFA}$ as a respective one of the first APT voltages $V_{CCA}$, $V_{CCB}$. Likewise, the control circuit 22 can also cause at least one of the second voltage outputs 20C, 20D to output the second reference voltage $V_{REFB}$ as a respective one of the second APT voltages $V_{CCC}$, $V_{CCD}$.

In one example, the control circuit 22 determine that a first one (e.g., $V_{TGTA}$) of the first APT target voltages $V_{TGTA}$, $V_{TGTB}$ is higher than a second one (e.g., $V_{TGTB}$) of the first APT target voltages $V_{TGTA}$, $V_{TGTB}$ ($V_{TGTA}>V_{TGTB}$). In this regard, the control circuit 22 controls the first switcher circuit 12A to generate the first reference voltage $V_{REFA}$ based on the first one (e.g., $V_{TGTA}$) of the first APT target voltages $V_{TGTA}$, $V_{TGTB}$.

Accordingly, the control circuit 22 determines a first one (e.g., 24A) of the first hybrid circuits 24A, 24B coupled to a first one (e.g., 20A) of the first voltage outputs 20A, 20B that outputs a first one (e.g., $V_{CCA}$) of the first APT voltages $V_{CCA}$, $V_{CCB}$ corresponding to the first one (e.g., $V_{TGTA}$) of the first APT target voltages $V_{TGTA}$, $V_{TGTB}$. The control circuit 22 then controls the first one (e.g., 24A) of the first hybrid circuits 24A, 24B to operate in the switch mode to output the first reference voltage $V_{REFA}$ at the first one (e.g., 20A) of the first voltage outputs 20A, 20B.

Since the first reference voltage $V_{REFA}$ is generated based on the higher one (e.g., $V_{TGTA}$) of the first APT target voltages $V_{TGTA}$, $V_{TGTB}$, the first reference voltage $V_{REFA}$ may be too high for generating a second one (e.g., $V_{CCB}$) of the first APT voltages $V_{CCA}$, $V_{CCB}$. In this regard, the control circuit 22 further determines the second one (e.g., 24B) of the first hybrid circuits 24A, 24B coupled to a second one (e.g., 20B) of the first voltage outputs 20A, 20B that outputs the second one (e.g., $V_{CCB}$) of the first APT voltages $V_{CCA}$, $V_{CCB}$ corresponding to the second one (e.g., $V_{TGTB}$) of the first APT target voltages $V_{TGTA}$, $V_{TGTB}$. Accordingly, the control circuit 22 controls the second one (e.g., 24B) of the first hybrid circuits 24A, 24B to operate in the regulator mode to regulate (e.g., reduce) the first reference voltage $V_{REFA}$ and/or the first low-frequency current $I_{REFA}$ at the second one (e.g., 20B) of the first voltage outputs 20A, 20B.

In another example, the control circuit 22 determine that a first one (e.g., $V_{TGTA}$) of the first APT target voltages $V_{TGTA}$, $V_{TGTB}$ is equal to a second one (e.g., $V_{TGTB}$) of the first APT target voltages $V_{TGTA}$, $V_{TGTB}$ ($V_{TGTA}=V_{TGTB}$). In this regard, the control circuit 22 controls the first switcher circuit 12A to generate the first reference voltage $V_{REFA}$ based on any one of the first one (e.g., $V_{TGTA}$) of the first APT target voltages $V_{TGTA}$, $V_{TGTB}$ and the second one (e.g., $V_{TGTB}$) of the first APT target voltages $V_{TGTA}$, $V_{TGTB}$.

Accordingly, the control circuit 22 configures the first hybrid circuits 24A, 24B to both operate in the switch mode to output the first reference voltage $V_{REFA}$ to the first voltage outputs 20A, 20B, respectively.

In another example, the control circuit 22 determine that a first one (e.g., $V_{TGTC}$) of the second APT target voltages $V_{TGTC}$, $V_{TGTD}$ is higher than a second one (e.g., $V_{TGTD}$) of the second APT target voltages $V_{TGTC}$, $V_{TGTD}$ ($V_{TGTC}$>$V_{TGTD}$). In this regard, the control circuit 22 controls the second switcher circuit 12B to generate the second reference voltage $V_{REFB}$ based on the first one (e.g., $V_{TGTC}$) of the second APT target voltages $V_{TGTC}$, $V_{TGTD}$.

Accordingly, the control circuit 22 determines a first one (e.g., 24C) of the second hybrid circuits 24C, 24D coupled to a first one (e.g., 20C) of the second voltage outputs 20C, 20D that outputs a first one (e.g., $V_{CCC}$) of the second APT voltages $V_{CCC}$, $V_{CCD}$ corresponding to the first one (e.g., $V_{TGTC}$) of the second APT target voltages $V_{TGTC}$, $V_{TGTD}$. The control circuit 22 then controls the first one (e.g., 24C) of the second hybrid circuits 24C, 24D to operate in the switch mode to output the second reference voltage $V_{REFB}$ at the first one (e.g., 20C) of the second voltage outputs 20C, 20D.

Since the second reference voltage $V_{REFB}$ is generated based on the higher one (e.g., $V_{TGTC}$) of the second APT target voltages $V_{TGTC}$, $V_{TGTD}$, the second reference voltage $V_{REFB}$ may be too high for generating a second one (e.g., $V_{CCD}$) of the second APT voltages $V_{CCC}$, $V_{CCD}$. In this regard, the control circuit 22 further determines a second one (e.g., 24D) of the second hybrid circuits 24C, 24D coupled to a second one (e.g., 20D) of the second voltage outputs 20C, 20D that outputs the second one (e.g., $V_{CCD}$) of the second APT voltages $V_{CCC}$, $V_{CCD}$ corresponding to the second one (e.g., $V_{TGTD}$) of the second APT target voltages $V_{TGTC}$, $V_{TGTD}$. Accordingly, the control circuit 22 controls the second one (e.g., 24D) of the second hybrid circuits 24C, 24D to operate in the regulator mode to regulate (e.g., reduce) the second reference voltage $V_{REFB}$ and/or the second low-frequency current $I_{REFB}$ at the second one (e.g., 20D) of the second voltage outputs 20C, 20D.

In another example, the control circuit 22 determine that a first one (e.g., $V_{TGTC}$) of the second APT target voltages $V_{TGTC}$, $V_{TGTD}$ is equal to a second one (e.g., $V_{TGTD}$) of the second APT target voltages $V_{TGTC}$, $V_{TGTD}$ ($V_{TGTC}$=$V_{TGTD}$). In this regard, the control circuit 22 controls the second switcher circuit 12B to generate the second reference voltage $V_{REFB}$ based on any one of the first one (e.g., $V_{TGTC}$) of the second APT target voltages $V_{TGTC}$, $V_{TGTD}$ and the second one (e.g., $V_{TGTD}$) of the second APT target voltages $V_{TGTC}$, $V_{TGTD}$. Accordingly, the control circuit 22 configures the second hybrid circuits 24C, 24D to both operate in the switch mode to output the second reference voltage $V_{REFB}$ to the second voltage outputs 20C, 20D, respectively.

The APT power management circuit 10 can be provided in an APT apparatus 28 that further includes a pair of first power amplifiers 30A, 30B and a pair of second power amplifiers 30C, 30D. The first power amplifiers 30A, 30B are coupled to the first voltage outputs 20A, 20B, respectively. Accordingly, first power amplifiers 30A, 30B are configured to amplify a pair of first radio frequency (RF) signals 32A, 32B based on the first APT voltages $V_{CCA}$, $V_{CCB}$, respectively. In a non-limiting example, the first RF signals 32A, 32B can be Wi-Fi signals to be transmitted in a 2.4 GHz band. The first RF signals 32A, 32B can be identical or different.

The second power amplifiers 30C, 30D are coupled to the second voltage outputs 20C, 20D, respectively. Accordingly, second power amplifiers 30C, 30D are configured to amplify a pair of second RF signals 32C, 32D based on the second APT voltages $V_{CCC}$, $V_{CCD}$, respectively. In a non-limiting example, the second RF signals 32C, 32D can be Wi-Fi signals to be transmitted in a 5 GHz band. The second RF signals 32C, 32D can be identical or different.

Notably, in the APT power management circuit 10, the first reference voltage $V_{REFA}$ can only be provided to one or more of the first voltage outputs 20A, 20B and the second reference voltage $V_{REFB}$ can only be provided to one or more of the second voltage outputs 20C, 20D. In certain operating scenarios, such configuration may cause some of the first hybrid circuits 24A, 24B and the second hybrid circuits 24C, 24D to operate at suboptimal efficiency.

For example, if the first APT target voltages $V_{TGTA}$, $V_{TGTB}$ and the second APT target voltages $V_{TGTC}$, $V_{TGTD}$ are set at 5 V, 2 V, 2.5 V, and 1 V, respectively, then the control circuit 22 will set the first reference voltage $V_{REFA}$ and the second reference voltage $V_{REFB}$ at 5 V (=$V_{TGTA}$) and 2.5 V (=$V_{TGTC}$), respectively. Accordingly, the first hybrid circuit 24A will operate in the switch mode to provide the first reference voltage $V_{REFA}$ to the first voltage output 20A as the first APT voltage $V_{CCA}$. In contrast, the first hybrid circuit 24B needs to operate in the regulator mode to reduce the first reference voltage $V_{REFA}$ from 5 V to 2 V (60% reduction) to thereby generate the first APT voltage $V_{CCB}$. However, if the first hybrid circuit 24B can instead generate the first APT voltage $V_{CCB}$ based on the second reference voltage $V_{REFB}$, then the first hybrid circuit 24B only needs to reduce the second reference voltage $V_{REFB}$ from 2.5 V to 2 V (20% reduction) to thereby generate the first APT voltage $V_{CCB}$. As a result, the first hybrid circuit 24B can operate with higher efficiency based on the second reference voltage $V_{REFB}$. Hence, it is desirable to flexibly provide any of the first reference voltage $V_{REFA}$ and the second reference voltage $V_{REFB}$ to any of the first voltage outputs 20A, 20B and the second voltage outputs 20C, 20D.

In this regard, FIG. 2 is a schematic diagram of an exemplary APT power management circuit 34 configured according to another embodiment of the present disclosure. Common elements between FIGS. 1 and 2 are shown therein with common element numbers and will not be re-described herein.

The APT power management circuit 34 further includes a coupling circuit 36, which is coupled between the first reference node 14A and the second reference node 14B. As such, the coupling circuit 36 can receive both the first reference voltage $V_{REFA}$ and the second reference voltage $V_{REFB}$. Accordingly, the control circuit 22 can selectively couple the first reference voltage $V_{REFA}$ to one or more of the second hybrid circuits 24C, 24D and/or selectively couple the second reference voltage $V_{REFB}$ to one or more of the first hybrid circuits 24A, 24B. In a non-limiting example, the control circuit 22 can control the coupling circuit 36 via a coupling control signal 38.

When operating in the regulator mode, each of the first hybrid circuits 24A, 24B and the second hybrid circuits 24C, 24D may suffer an efficiency loss that can be approximated by an equation (Eq. 1) below.

$$\text{Efficiency Loss}=(V_{REF}-V_{CCX})*V_{CCX}/R_{LOADX} \quad \text{(Eq. 1)}$$

In the equation (Eq. 1), $V_{REF}$ represents any one of the first reference voltage $V_{REFA}$ and the second reference voltage $V_{REFB}$. $V_{CCX}$ represents any of the first APT voltages $V_{CCA}$, $V_{CCB}$ and the second APT voltages $V_{CCC}$, $V_{CCD}$. $R_{LOADX}$ represents a load impedance seen at any of the first voltage outputs 20A, 20B and the second voltage outputs 20C, 20D. In this regard, for a constant $V_{CCX}/R_{LOADX}$, the smaller a difference between $V_{REF}-V_{CCX}$, the lower the efficiency loss may be. As discussed in the operating examples below, the control circuit 22 can selectively couple any one of the first reference voltage $V_{REFA}$ and the second reference voltage $V_{REFB}$ to any of the first hybrid circuits 24A, 24B and the second hybrid circuits 24C, 24D to help reduce efficiency loss in the regulator mode.

In one example, the control circuit 22 can determine that a first one (e.g., $V_{TGTA}$) of the first APT target voltages $V_{TGTA}$, $V_{TGTB}$ is higher than a second one (e.g., $V_{TGTB}$) of the first APT target voltages $V_{TGTA}$, $V_{TGTB}$. Accordingly, the control circuit 22 configures the first switcher circuit 12A to generate the first reference voltage $V_{REFA}$ to be greater than or equal to the first one (e.g., $V_{TGTA}$) of the first APT target voltages $V_{TGTA}$, $V_{TGTB}$. In the meantime, the control circuit 22 may determine that the second reference voltage $V_{REFB}$ is lower than the first one (e.g., $V_{TGTA}$) of the first APT target voltages $V_{TGTA}$, $V_{TGTB}$, but is higher than the second one (e.g., $V_{TGTB}$) of the first APT target voltages $V_{TGTA}$, $V_{TGTB}$ ($V_{TGTA}$>$V_{REFB}$>$V_{TGTB}$). Accordingly, the control circuit 22 can control the coupling circuit 36 to couple the second reference voltage $V_{REFB}$ to the second one (e.g., 24B) of the first hybrid circuits 24A, 24B. Since the second reference voltage $V_{REFB}$ is higher than the second one (e.g., $V_{TGTB}$) of the first APT target voltages $V_{TGTA}$, $V_{TGTB}$, the control circuit 22 configures the second one (e.g., 24B) of the first hybrid circuits 24A, 24B to operate in the regulator mode to regulate the second reference voltage $V_{REFB}$.

In another example, the control circuit 22 can determine that a first one (e.g., $V_{TGTA}$) of the first APT target voltages $V_{TGTA}$, $V_{TGTB}$ is higher than a second one (e.g., $V_{TGTB}$) of the first APT target voltages $V_{TGTA}$, $V_{TGTB}$. Accordingly, the control circuit 22 configures the first switcher circuit 12A to generate the first reference voltage $V_{REFA}$ to be greater than or equal to the first one (e.g., $V_{TGTA}$) of the first APT target voltages $V_{TGTA}$, $V_{TGTB}$. In the meantime, the control circuit 22 may determine that the second reference voltage $V_{REFB}$ is lower than the first one (e.g., $V_{TGTA}$) of the first APT target voltages $V_{TGTA}$, $V_{TGTB}$, but is equal to the second one (e.g., $V_{TGTB}$) of the first APT target voltages $V_{TGTA}$, $V_{TGTB}$ ($V_{TGTA}$>$V_{REFB}$=$V_{TGTB}$). Accordingly, the control circuit 22 can control the coupling circuit 36 to couple the second reference voltage $V_{REFB}$ to the second one (e.g., 24B) of the first hybrid circuits 24A, 24B. Since the second reference voltage $V_{REFB}$ is equal to the second one (e.g., $V_{TGTB}$) of the first APT target voltages $V_{TGTA}$, $V_{TGTB}$, the control circuit 22 configures the second one (e.g., 24B) of the first hybrid circuits 24A, 24B to operate in the switch mode to output the second reference voltage $V_{REFB}$.

In another example, the control circuit 22 can determine that a first one (e.g., $V_{TGTC}$) of second first APT target voltages $V_{TGTC}$, $V_{TGTD}$ is higher than a second one (e.g., $V_{TGTD}$) of the second APT target voltages $V_{TGTC}$, $V_{TGTD}$. Accordingly, the control circuit 22 configures the second switcher circuit 12B to generate the second reference voltage $V_{REFB}$ to be greater than or equal to the first one (e.g., $V_{TGTC}$) of the second APT target voltages $V_{TGTC}$, $V_{TGTD}$. In the meantime, the control circuit 22 may determine that the first reference voltage $V_{REFC}$ is lower than the first one (e.g., $V_{TGTC}$) of the second APT target voltages $V_{TGTC}$, $V_{TGTD}$, but is higher than the second one (e.g., $V_{TGTD}$) of the second APT target voltages $V_{TGTC}$, $V_{TGTD}$ ($V_{TGTB}$>$V_{REFA}$>$V_{TGTD}$). Accordingly, the control circuit 22 can control the coupling circuit 36 to couple the first reference voltage $V_{REFA}$ to the second one (e.g., 24D) of the second hybrid circuits 24C, 24D. Since the first reference voltage $V_{REFA}$ is higher than the second one (e.g., $V_{TGTD}$) of the second APT target voltages $V_{TGTC}$, $V_{TGTD}$, the control circuit 22 configures the second one (e.g., 24D) of the second hybrid circuits 24C, 24D to operate in the regulator mode to regulate the first reference voltage $V_{REFA}$.

In another example, the control circuit 22 can determine that a first one (e.g., $V_{TGTC}$) of second first APT target voltages $V_{TGTC}$, $V_{TGTD}$ is higher than a second one (e.g., $V_{TGTD}$) of the second APT target voltages $V_{TGTC}$, $V_{TGTD}$. Accordingly, the control circuit 22 configures the second switcher circuit 12B to generate the second reference voltage $V_{REFB}$ to be greater than or equal to the first one (e.g., $V_{TGTC}$) of the second APT target voltages $V_{TGTC}$, $V_{TGTD}$. In the meantime, the control circuit 22 may determine that the first reference voltage $V_{REFC}$ is lower than the first one (e.g., $V_{TGTC}$) of the second APT target voltages $V_{TGTC}$, $V_{TGTD}$, but is equal to the second one (e.g., $V_{TGTD}$) of the second APT target voltages $V_{TGTC}$, $V_{TGTD}$ ($V_{TGTB}$>$V_{REFA}$=$V_{TGTD}$). Accordingly, the control circuit 22 can control the coupling circuit 36 to couple the first reference voltage $V_{REFA}$ to the second one (e.g., 24D) of the second hybrid circuits 24C, 24D. Since the first reference voltage $V_{REFA}$ is equal to the second one (e.g., $V_{TGTD}$) of the second APT target voltages $V_{TGTC}$, $V_{TGTD}$, the control circuit 22 configures the second one (e.g., 24D) of the second hybrid circuits 24C, 24D to operate in the switch mode to output the first reference voltage $V_{REFA}$.

Those skilled in the art will recognize improvements and modifications to the preferred embodiments of the present disclosure. All such improvements and modifications are considered within the scope of the concepts disclosed herein and the claims that follow.

What is claimed is:

1. An average power tracking (APT) power management circuit comprising:
   a first number of switcher circuits each configured to generate a respective one of a first number of reference voltages;
   a second number of hybrid circuits each configured to generate a respective one of a second number of APT voltages based on any one of the first number of reference voltages, wherein the second number of hybrid circuits is more than the first number of switcher circuits; and
   a control circuit configured to provide each of the first number of reference voltages to at least one of the second number of hybrid circuits; wherein each of the second number of hybrid circuits is further configured to: operate in a switch mode to generate the respective one of the second number of APT voltages that equals a respective one of the first number of reference voltages; and operate in a regulator mode to generate the respective one of the second number of APT voltages lower than the respective one of the first number of reference voltages.

2. The APT power management circuit of claim 1, wherein:
   the first number of switcher circuits comprises:
      a first switcher circuit configured to generate a first reference voltage among the first number of reference voltages at a first reference node; and
      a second switcher circuit configured to generate a second reference voltage among the first number of reference voltages at a second reference node;
   the second number of hybrid circuits comprises:
      a plurality of first hybrid circuits each coupled between the first reference node and a respective one of a plurality of first voltage outputs to output a respective one of a plurality of first APT voltages among the second number of APT voltages; and
a plurality of second hybrid circuits each coupled between the second reference node and a respective one of a plurality of second voltage outputs to output a respective one of a plurality of second APT voltages among the second number of APT voltages; and
the control circuit is further configured to:
cause at least one of the plurality of first voltage outputs to output the first reference voltage as the respective one of the plurality of first APT voltages; and
cause at least one of the plurality of second voltage outputs to output the second reference voltage as the respective one of the plurality of second APT voltages.

3. The APT power management circuit of claim 2, wherein the control circuit is further configured to:
receive a plurality of first APT target voltages corresponding to the plurality of first APT voltages, respectively;
determine that a first one of the plurality of first APT target voltages is higher than a second one of the plurality of first APT target voltages;
determine a first one of the plurality of first hybrid circuits coupled to a first one of the plurality of first voltage outputs that outputs a first one of the plurality of first APT voltages corresponding to the first one of the plurality of first APT target voltages; and
control the first one of the plurality of first hybrid circuits to operate in the switch mode to output the first reference voltage at the first one of the plurality of first voltage outputs.

4. The APT power management circuit of claim 3, wherein the control circuit is further configured to:
determine a second one of the plurality of first hybrid circuits coupled to a second one of the plurality of first voltage outputs that outputs a second one of the plurality of first APT voltages corresponding to the second one of the plurality of first APT target voltages; and
control the second one of the plurality of first hybrid circuits to operate in the regulator mode to regulate the first reference voltage at the second one of the plurality of first voltage outputs.

5. The APT power management circuit of claim 2, wherein the control circuit is further configured to:
receive a plurality of second APT target voltages corresponding to the plurality of second APT voltages, respectively;
determine that a first one of the plurality of second APT target voltages is higher than a second one of the plurality of second APT target voltages;
determine a first one of the plurality of second hybrid circuits coupled to a first one of the plurality of second voltage outputs that outputs a first one of the plurality of second APT voltages corresponding to the first one of the plurality of second APT voltages; and
control the first one of the plurality of second hybrid circuits to operate in the switch mode to output the first reference voltage at the first one of the plurality of second voltage outputs.

6. The APT power management circuit of claim 5, wherein the control circuit is further configured to:
determine a second one of the plurality of second hybrid circuits coupled to a second one of the plurality of second voltage outputs that outputs a second one of the plurality of second APT voltages corresponding to the second one of the plurality of second APT voltages; and
control the second one of the plurality of second hybrid circuits to operate in the regulator mode to regulate the first reference voltage at the second one of the plurality of second voltage outputs.

7. An average power tracking (APT) apparatus comprising:
an APT power management circuit comprising:
a first number of switcher circuits each configured to generate a respective one of a first number of reference voltages;
a second number of hybrid circuits each configured to generate a respective one of a second number of APT voltages based on any one of the first number of reference voltages, wherein the second number of hybrid circuits is more than the first number of switcher circuits; and
a control circuit configured to provide each of the first number of reference voltages to at least one of the second number of hybrid circuits; wherein each of the second number of hybrid circuits is further configured to: operate in a switch mode to generate the respective one of the second number of APT voltages that equals a respective one of the first number of reference voltages; and operate in a regulator mode to generate the respective one of the second number of APT voltages lower than the respective one of the first number of reference voltages.

8. The APT apparatus of claim 7, wherein:
the first number of switcher circuits comprises:
a first switcher circuit configured to generate a first reference voltage among the first number of reference voltages at a first reference node; and
a second switcher circuit configured to generate a second reference voltage among the first number of reference voltages at a second reference node;
the second number of hybrid circuits comprises:
a plurality of first hybrid circuits each coupled between the first reference node and a respective one of a plurality of first voltage outputs to output a respective one of a plurality of first APT voltages among the second number of APT voltages; and
a plurality of second hybrid circuits each coupled between the second reference node and a respective one of a plurality of second voltage outputs to output a respective one of a plurality of second APT voltages among the second number of APT voltages; and
the control circuit is further configured to:
cause at least one of the plurality of first voltage outputs to output the first reference voltage as the respective one of the plurality of first APT voltages; and
cause at least one of the plurality of second voltage outputs to output the second reference voltage as the respective one of the plurality of second APT voltages.

9. The APT apparatus of claim 8 further comprising:
a plurality of first power amplifiers each coupled to a respective one of the plurality of first voltage outputs and configured to amplify a respective one of a plurality of first radio frequency (RF) signals based on a respective one of the plurality of first APT voltages; and
a plurality of second power amplifiers each coupled to a respective one of the plurality of second voltage outputs and configured to amplify a respective one of a plurality of second RF signals based on a respective one of the plurality of second APT voltages.

10. The APT apparatus of claim 8 wherein the APT power management circuit further comprises a coupling circuit coupled between the first reference node and the second reference node, wherein the control circuit is further configured to:
 selectively couple the first reference voltage to one or more of the plurality of second hybrid circuits; and
 selectively couple the second reference voltage to one or more of the plurality of first hybrid circuits.

* * * * *